(12) United States Patent
Moore et al.

(10) Patent No.: US 6,986,091 B2
(45) Date of Patent: *Jan. 10, 2006

(54) METHOD AND APPARATUS FOR TESTING A HIGH SPEED DATA RECEIVER FOR JITTER TOLERANCE

(75) Inventors: Charles E Moore, Loveland, CO (US); Aaron M. Volz, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 300 days.

This patent is subject to a terminal disclaimer.

(21) Appl. No.: 10/228,909

(22) Filed: Aug. 27, 2002

(65) Prior Publication Data

US 2004/0044948 A1  Mar. 4, 2004

(51) Int. Cl.
*G01R 11/00* (2006.01)
(52) U.S. Cl. .................. 714/738; 714/700; 713/500
(58) Field of Classification Search .............. 714/700, 714/738, 724, 704, 744, 819, 746; 713/500, 713/502, 503

See application file for complete search history.

(56) References Cited

U.S. PATENT DOCUMENTS

| | | | | |
|---|---|---|---|---|
| 5,163,069 A | * | 11/1992 | Hayashi | 375/357 |
| 5,463,639 A | * | 10/1995 | Koishi et al. | 714/740 |
| 5,694,425 A | * | 12/1997 | Suganuma et al. | 375/240 |
| 6,374,388 B1 | * | 4/2002 | Hinch | 714/799 |
| 6,580,538 B1 | * | 6/2003 | Kartalopoulos | 398/79 |
| 6,693,881 B1 | * | 2/2004 | Huysmans et al. | 370/236.1 |

* cited by examiner

*Primary Examiner*—Phung My Chung

(57) ABSTRACT

A method and apparatus is presented for measuring jitter tolerance in a device under test. A device under test is established to operate at a specific frequency. A bit pattern is generated from a bit pattern generator. The bit pattern generated by the bit pattern generator is produced at a frequency that is a multiple of the frequency that the device under test is operating under. Bits are systematically changed in the bit pattern and then errors are measured in the device under test. As a result, the jitter tolerance of the device under test is measured.

9 Claims, 4 Drawing Sheets

METHOD AND APPARATUS FOR TESTING A HIGH SPEED DATA RECEIVER FOR JITTER TOLERANCE

BACKGROUND OF THE INVENTION

1. Field of the Invention

This invention relates to signal processing. Specifically, the present invention relates to signal testing.

2. Description of the Related Art

Communication systems include a transmitter communicating information and a receiver receiving information. In digital communication systems the transmitter communicates a pattern of zeros and ones to the receiver. The zeros and ones are used to represent the communicated information. Both the transmitter and receiver synchronize so that the receiver can distinguish between a logical zero and a logical one.

When high-speed digital data is transmitted over a communication channel with limited bandwidth the digital data may be degraded. One form of degradation results from the transition between digital states (e.g. zeros and ones). The transitions may be delayed by different amounts depending on surrounding data and other effects. This variation in delay of transitions is known as jitter. The variation (e.g., delay) moves the signal forward or backward. In other words, the signal (e.g. zero or one) may occur before the receiver is scheduled to sample the transition or the delay may occur after the receiver starts to sample the transition. If the receiver samples data at discrete times and jitter delay moves the transition between digital states, at a time that is different from the time expected by the receiver, the wrong data may be sampled. Improperly sampling or interpreting data in the receiver will result in an error. When the error is caused by jitter, the error is known as a jitter error.

The ability of a receiver to sample data correctly in the presence of jitter is known as jitter tolerance. The jitter tolerance is typically quantified as the peak-to-peak jitter, which is present without causing an unacceptable error rate. Measuring jitter tolerance of receivers is an important operation in the manufacture of high-speed receivers. Applying a representative signal with a known amount of jitter to a receiver and measuring the error rate is a conventional technique used to measure jitter tolerance.

As clock speeds in computers and data rates in communication systems increase, timing budgets become tighter and the need to measure and characterize jitter becomes more critical. On some networks, devices such as jitter generators may be used to generate a known amount of jitter. The jitter generator introduces jitter in a communication connection. Using these generators the jitter tolerance of the communication link (transmitter, receiver) may be determined before deploying the transmitter and receiver to the field or prior to implementing production of the transmitter or receiver.

A number of conventional techniques have been used to measure jitter tolerance. In one method a test signal is generated by clocking data with a frequency modulated clock. The clock signal is shifted to introduce errors into the signal. The signal is measured in the receiver to determine the amount of error. However, a disadvantage in this approach is the availability of clocks, which can be modulated to a large jitter, at high data rates. In addition, the modulation is symmetrical therefore the test cannot independently measure sensitivity to early and late transitions.

In a second conventional technique a test signal is filtered in a calibrated filter (e.g. low pass filter) and, optionally, the filtered signal is passed through a limiting amplifier to prevent interactions with any peaking or roll off in the receiver. However, in this approach, calibration is necessary and can be difficult; it is hard to adjust the amount of jitter; and, the modulation is symmetrical, therefore the test signal cannot independently measure sensitivity to early and late transitions.

In a third approach noise is added to a test signal with slow rise and fall times and optionally, a signal is passed through a limiting amplifier. However, in this approach, calibration is necessary and can be difficult to perform; the results of this approach is statistical in nature and therefore is hard to reproduce; and the modulation is symmetrical therefore it is difficult to measure sensitivity to early and late transitions.

Thus, there is a need in the art for a method and apparatus that measures jitter tolerance. There is a need in the art for a method and apparatus that measures jitter tolerance in high bandwidth communication links. There is a need in the art for a method and apparatus of measuring jitter tolerance that is flexible and enables the operator to easily measure a range of jitter tolerances. There is a need in the art for a method and apparatus of measuring jitter tolerance that is easily reproducible.

SUMMARY OF THE INVENTION

In one embodiment of the present invention a method of testing jitter comprises the steps of generating a first bit pattern, wherein the first bit pattern is generated at a multiple of a communication speed of a receiver; generating a second bit pattern by adjusting the first bit pattern; communicating the second test pattern; generating a third bit pattern by receiving bits in the receiver in response to communicating the second bit pattern; and testing the third bit pattern for jitter. In the method, the step of generating the second bit pattern includes adjusting the first bit pattern by removing at least one bit from the first bit pattern. The step of generating the second bit pattern includes adjusting the first bit pattern by changing at least one bit in the first bit pattern. The step of testing the bit third bit pattern for jitter includes testing the third bit pattern in the receiver. The step of testing the third bit pattern for jitter includes comparing the second bit pattern with the third bit pattern.

In another embodiment, a method of testing jitter comprises the steps of receiving a third bit pattern in a receiver, the third bit pattern produced by generating a first bit pattern which is a multiple of a communications speed of the receiver, changing at least one bit in the first bit pattern thereby producing a second bit pattern and receiving the second bit pattern in the receiver thereby producing the third bit pattern; and testing the third bit pattern for jitter by comparing the second bit pattern to the third bit pattern.

In a third embodiment, a method of testing jitter comprises the steps of (a) generating a bit pattern wherein the bit pattern is a multiple of an operating frequency of a receiver; (b) generating a test pattern by changing at least one bit in the bit pattern; (c) generating a received test pattern by receiving bits in the receiver in response to communicating the test pattern; (d) determining jitter by testing whether the test pattern matches the received test pattern;(e) perform steps (a) through (e) until jitter is determined as defined in step (d).

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

A method and apparatus of performing jitter testing is presented. In one embodiment of the present invention a bit pattern generator generates a test pattern (e.g., a known sequence of bits). A bit error rate tester (e.g. BERT tester) is connected to a device under test. The device under test is a receiver that receives the generated test pattern. The test pattern is a known test pattern that is generated according to the methodology of the present invention. The BERT tester, test the test pattern to determine if there are any errors.

The test pattern is a digital signal, which is represented by digital values (e.g. logical 0 and logical 1). In the method and apparatus of the present invention the digital signal include transitions (e.g. changes from 0 to 1) which can be individually changed by a known amount. Each transition can be delayed or advanced by a known amount or an integral number of displacement times.

In one embodiment of the present invention a data pattern generator is presented. The data pattern generator is clocked at a multiple of the data rate of the receiver. For example, if the receiver operates at 1×, in the method of the present invention, the data pattern generator may generate data patterns at a rate of 2×, 3×, 4×, etc.

Figure 1:
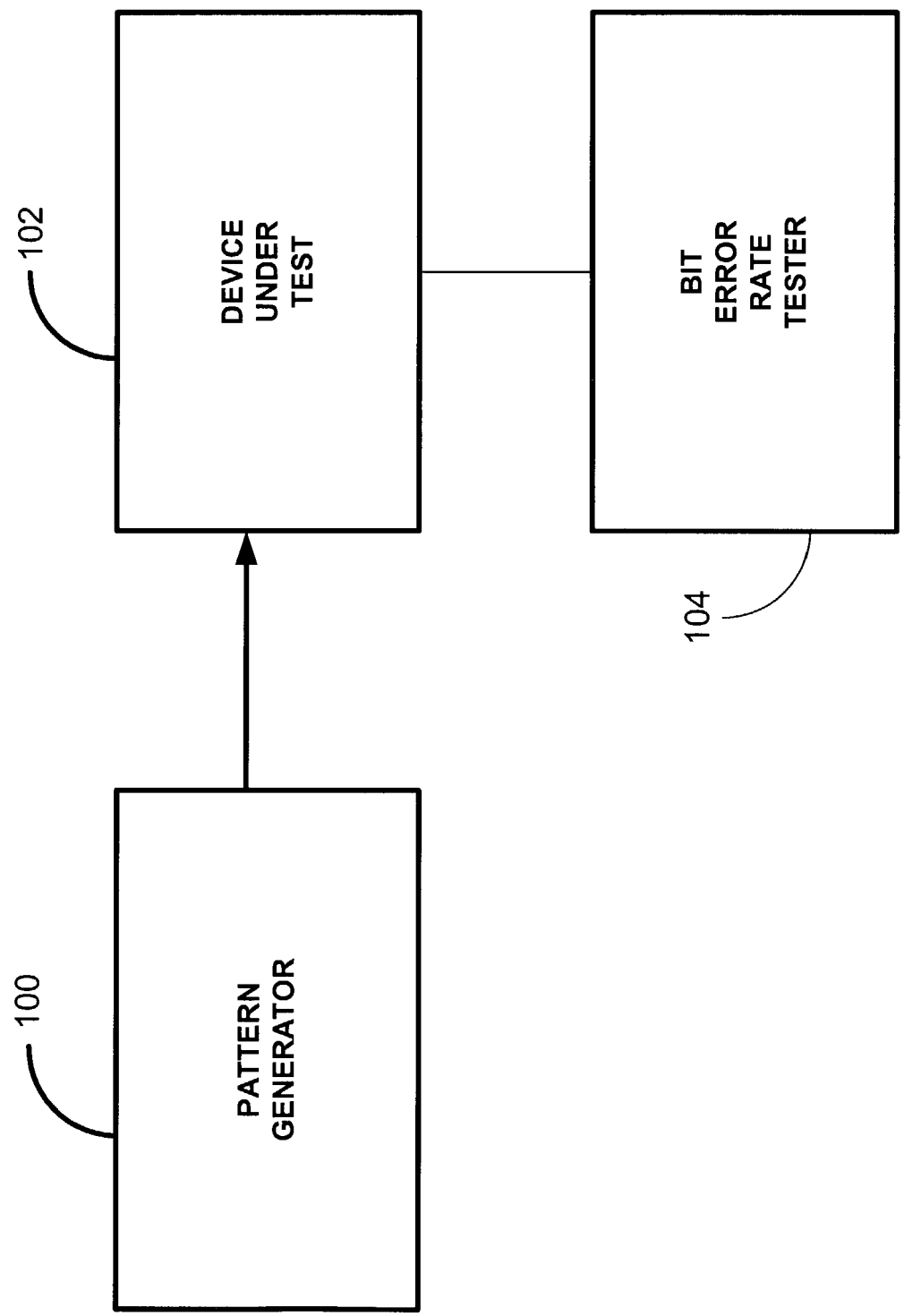
FIG. 1 displays an apparatus implementing the present invention.

In FIG. 1 an architecture implementing the method and apparatus of the present invention is displayed. In FIG. 1 a pattern generator is shown as 100. The pattern generator 100 has an adjustable frequency. As a result, the pattern generator 100 may adjust frequencies by a predetermined amount. In other words, the pattern generator 100 performs oversampling on a signal and produces a test pattern. The test pattern is transmitted to a receiver. The transmitted test pattern is communicated to a device under test (e.g., DUT) shown as 102. The DUT is a receiver that operates at a fixed frequency or a known frequency for a specific test period. For example, if the DUT 102 operates at 1×, the pattern generator 100 may operate at a multiple of 1× such as 2×, 3×, 4×, 5×, etc. A BERT tester 104 is connected to the DUT 102. The BERT tester 104 analyzes/measures the test pattern to determine errors in the test pattern.

Figure 2:
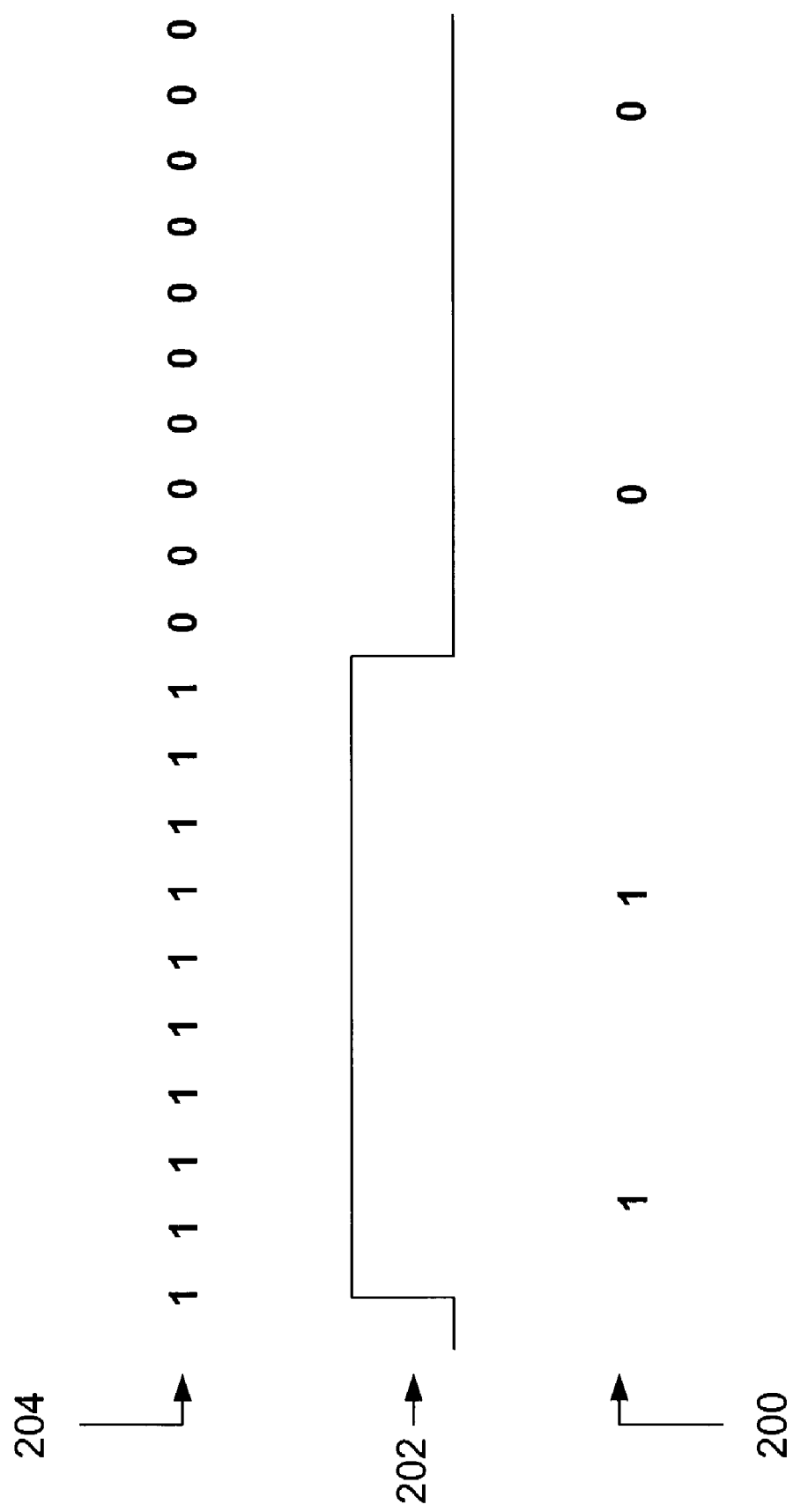
FIG. 2 displays a conceptual drawing of a bit pattern implementing the method and apparatus of the present invention.

FIG. 2 displays a conceptual drawing of a bit pattern implementing the method and apparatus of the present invention. The bit pattern 200 (e.g. 1100) is the bit pattern that is being tested. This is the bit pattern (e.g., 1100) that we will expect the DUT to properly interpret. The bit pattern 200 is represented graphically by the signal shown as 202. In one embodiment of the present invention, 5× oversampling is performed to test the device under test. The bit pattern 204 (e.g. 11111111110000000000) is a bit pattern generated by 5× over-sampling. The bit pattern 204 will be generated by the bit pattern generator and transmitted to the DUT. In the case of 5× over-sampling, the bit pattern 204 is generated by replicating each bit in the bit pattern 200 five times. Therefore, the first bit in bit pattern 200 (e.g., 1) is replicated five times (e.g., 11111). The second bit in the bit pattern 200 (e.g., 1) is replicated five times (e.g., 11111). The third bit in the bit pattern 200 (e.g., 0) is replicated five times (e.g., 00000) and the fifth bit in the bit pattern 200 (e.g., 0) is replicated five times.

Figure 3:
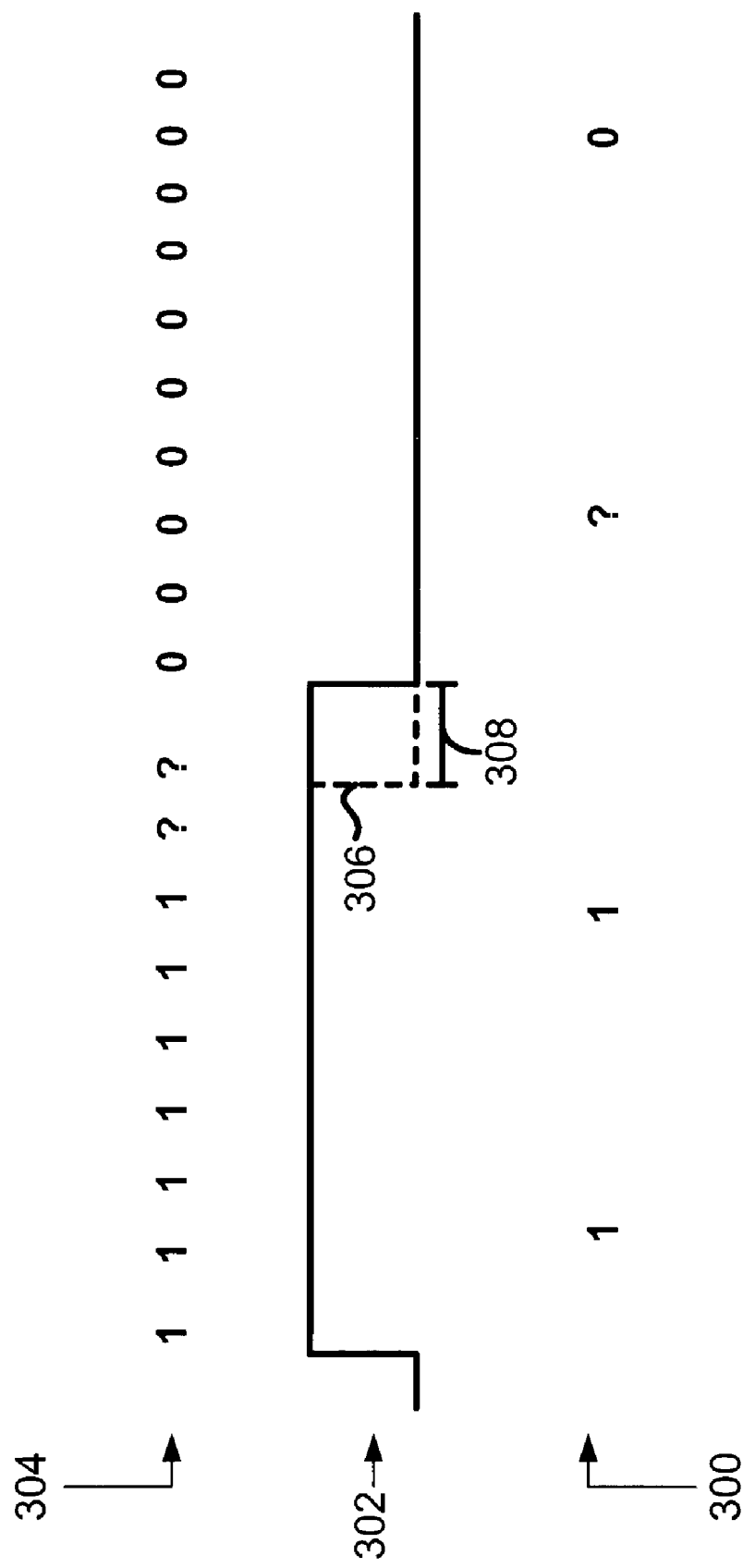
FIG. 3 displays a conceptual drawing of a bit pattern implementing the method and apparatus of the present invention.

FIG. 3 displays a bit pattern 304 generated by the bit pattern generator (e.g. 11111111110000000000). In one method of the present invention the bits in the bit pattern 304 may be changed to determine the jitter tolerance of the DUT. For example, in bit pattern 304, the bits designated by "?" may be changed. As such bit pattern 304, "11111111110000000000" may be changed to bit pattern "11111111??0000000000," where the two logical values designated by "??" may be changed. A graphical outline which corresponds to the time interval associated with the two logical values, "??" is shown as 306. The time interval associated with the two logical values designated as "??" is shown as 308. In addition to changing the values designated by "??," it should be appreciated that in an alternative embodiment, these values may be removed from the bit pattern to test for jitter.

In response to generating a bit pattern 304, where the two logical values designated by "??" are changed, the bit pattern 300 received by the DUT may also change as represented by "11?0," where "?" represents a value that will be measured to determine the jitter tolerance of the DUT. Should the DUT receive the value designated by the "?" in the bit pattern 300 as a logical 0, the DUT is capable of interpreting a signal with 0.4 unit-interval of jitter. A graphical depiction of 0.4 unit-interval jitter is shown as 308.

Table I, shown below displays the pattern generator frequency and the associated bit pattern that would be transmitted from the receiver to the DUT.

TABLE I

| PATTERN GENERATOR FREQUENCY | BIT PATTERN TRANSMITTED | | | |
|---|---|---|---|---|
| 1X | 1 | 1 | 0 | 0 |
| 2X | 11 | 11 | 00 | 00 |
| 5X | 11111 | 11111 | 00000 | 00000 |

For example as shown in Table I, if a 1× bit pattern is 1100, a 2× bit pattern would be 11110000 and a 5× bit pattern would be 11111111110000000000, etc. It should be noted that the each bit is replicated a number of times corresponding to the pattern generator frequency.

Table II, given below displays the induced jitter for a pattern generator frequency and the resulting bit pattern.

TABLE II

| PATTERN GENERATOR FREQUENCY | INDUCED JITTER | BIT PATTERN TRANSMITTED | | | |
|---|---|---|---|---|---|
| 2X | +0.5 | 11 | 11 | 10 | 00 |
| 2X | −0.5 | 11 | 10 | 00 | 00 |
| 3X | +0.33 | 111 | 11.1 | 100 | 000 |
| 3X | −0.33 | 111 | 110 | 000 | 000 |
| 5X | +0.2 | 11111 | 11111 | 10000 | 00000 |
| 5X | +0.4 | 11111 | 11111 | 11000 | 00000 |

In Table II, a 1× bit pattern (not shown) is 1100. Therefore, a 2× bit pattern is generated as 11110000, a 3× bit pattern would take the form of 111111000000, and a 5× bit pattern would take the form of 11111111110000000000. However, in order to test the jitter tolerance the bit pattern is changed to determine if the DUT will evaluate the bit pattern as 1100. As shown in Table II, at 2× frequency, a bit pattern of 11111000 and 11100000 is sent instead of 11110000, to determine if the DUT can withstand a +0.5 unit-interval or −0.5 unit-interval induced tolerance, respectively. In order to test +0.33 unit-interval or −0.33 unit-interval induced tolerance, 3× over-sampling is implemented and bit patterns 111111100000 and 111110000000 are transmitted. In order to test +0.2 unit-interval and +0.4 unit-interval induced tolerance at 5× over-sampling, the bit patterns 11111111111000000000 and 11111111111100000000 are transmitted. If the DUT is still able to distinguish the bit pattern as 1100, then the DUT has demonstrated a jitter tolerance at the various levels (e.g., +0.5, −0.5, +0.33, 0.33, +0.2, +0.4).

Figure 4:
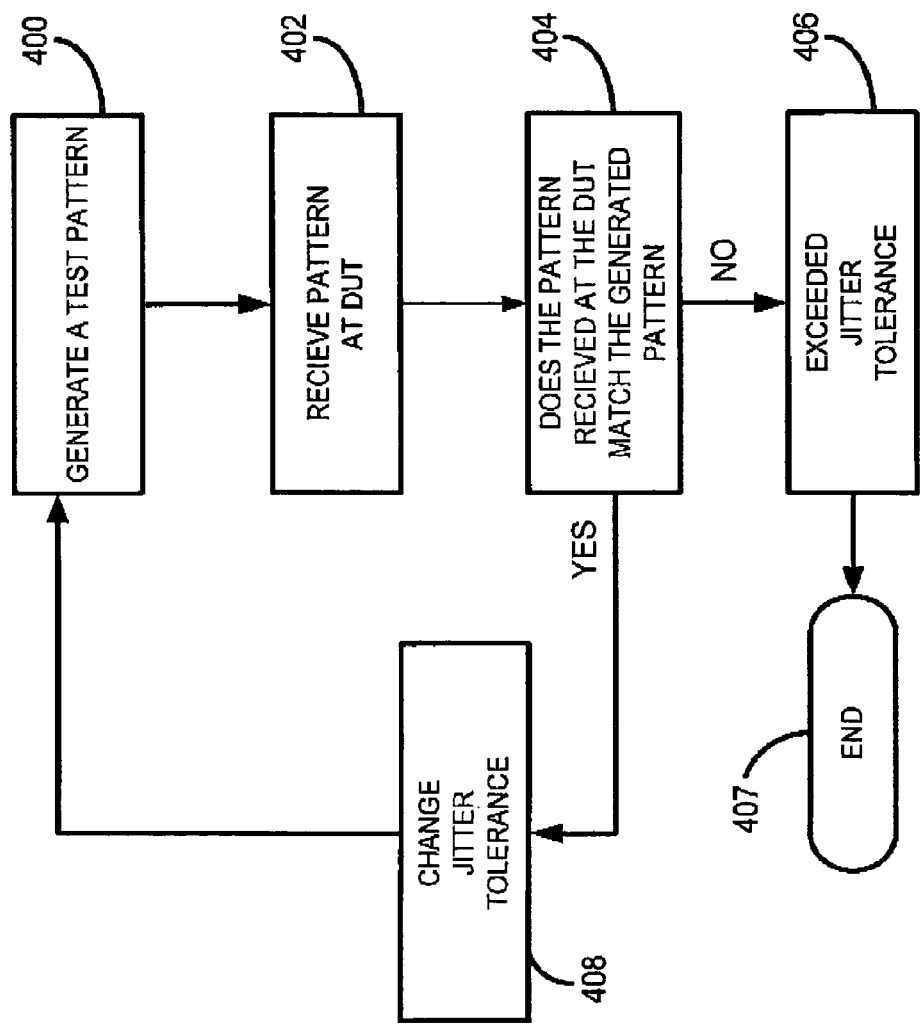
FIG. 4 displays a flow chart of the method of the present invention.

FIG. 4 displays a flow chart of a method of the present invention. In FIG. 4. the pattern generator generates a test pattern as shown at 400. The test pattern is a multiple of the frequency that the DUT is configured to receive. Therefore, if the DUT is configured to receive communication at 1×, the test pattern is generated at 2×, 3×, 4×, 5×, etc. The test pattern is then received at the DUT as shown at 402. Once the test pattern is received at the DUT the test pattern is analyzed to determine if the test pattern received at the DUT matches the test pattern generated by the pattern generator. The test pattern is analyzed by a BERT tester. If the test pattern received at the DUT does not match the test pattern generated by the test pattern generator, the maximum tolerance of the DUT is exceeded as shown at 406. Once the maximum tolerance of the DUT is exceeded the method ends as shown at 407. However, if the test pattern received at the DUT matches the test pattern generated by the test pattern generator, the jitter tolerance is changed as shown in 408. By incrementally changing the jitter tolerance, the jitter tolerance of the DUT may be accurately identified.

The test pattern may be changed in a number of different ways. For example, in one embodiment of the present invention, the amount of over-sampling may be changed until there is a failure in the DUT. Therefore, the test pattern generator may generate a pattern at 1×, then 2×, then 3×, etc. In another embodiment of the present invention, the pattern generator may start generating patterns at a high over-sampling rate, such as 8× or 9× and work back down to 1×. In a third embodiment, the pattern generator may change the bit pattern for a specific sampling rate. For example, when using 2× over-sampling, for a bit pattern 1100, instead of sending 11110000, the pattern generator may send the value 11100000. Lastly, a combination of changing the over-sampling rates and the bit patterns within the over-sampling rates may be used to test for jitter tolerance.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A method of testing jitter comprising the steps of:
generating a first bit pattern, wherein the first bit pattern is generated at a multiple of a communication speed of a receiver;
generating a second bit pattern by adjusting the first bit pattern;
receiving a third bit pattern in response to communicating the second bit pattern; and
testing the third bit pattern for jitter.

2. A method as set forth in claim 1, wherein the step of generating the second bit pattern includes adjusting the first bit pattern by removing at least one bit from the first bit pattern.

3. A method as set forth in claim 1, wherein the step of generating the second bit pattern includes adjusting the first bit pattern by changing at least one bit in The first bit pattern.

4. A method as set forth in claim 1, wherein the step of testing the third bit pattern for jitter includes testing the third bit pattern in the receiver.

5. A method as set forth in claim 1, wherein the step of testing the third bit pattern for jitter includes comparing the first bit pattern with the third bit pattern.

6. An apparatus for testing jitter comprising:
means for generating a first bit pattern, wherein the first bit pattern is generated at a multiple of a communication speed of a receiver;
means for generating a second bit pattern by adjusting the first bit pattern;
means for communicating the second test pattern;
means for generating a third bit pattern by receiving bits in the receiver in response to communicating the second bit pattern; and
means for testing the third bit pattern for jitter.

7. A method of testing jitter comprising the steps of:
receiving a third bit pattern in a receiver, the third bit pattern produced by generating a first bit pattern which is a multiple of a communications speed of the receiver, changing at least one bit in the first bit pattern thereby producing a second bit pattern and receiving the second bit pattern in the receiver thereby producing the third bit pattern; and
testing the third bit pattern for jitter by comparing the first bit pattern to the third bit pattern.

8. An apparatus for testing jitter comprising:
means for receiving a third bit pattern in a receiver, the third bit pattern produced by generating a first bit pattern which is a multiple of a communications speed of the receiver, changing at least one bit in the first bit pattern thereby producing a second bit pattern and receiving the second bit pattern in the receiver thereby producing the third bit pattern; and
means for testing the third bit pattern for jitter by comparing the first bit pattern to the third bit pattern.

9. A method of testing jitter comprising the steps of:
(a) generating an original bit pattern wherein the original bit pattern is a multiple of an operating frequency of a receiver;
(b) generating a test pattern by changing at least one bit in the original bit pattern;
(c) generating a received test pattern by receiving bits in the receiver in response to conirnunicating the test pattern;
(d) detennining jitter by testing whether the original bit pattern matches the received test pattern; and
(e) perform steps (a) through (d) until jitter is determined as defined in step (d).

* * * * *

UNITED STATES PATENT AND TRADEMARK OFFICE
CERTIFICATE OF CORRECTION

| | | |
|---|---|---|
| PATENT NO. | : 6,986,091 B2 | Page 1 of 1 |
| APPLICATION NO. | : 10/228909 | |
| DATED | : January 10, 2006 | |
| INVENTOR(S) | : Charles E. Moore et al. | |

It is certified that error appears in the above-identified patent and that said Letters Patent is hereby corrected as shown below:

Column 6, Line 13 (Approx.), Claim 3, delete "The" and insert -- the --;

Column 6, Line 60 (Approx.), Claim 9, delete "conimunicating" and insert -- communicating --;

Column 6, Line 62 (Approx.), Claim 9, delete "detennining" and insert -- determining --.

Signed and Sealed this
Twenty-sixth Day of February, 2013

Teresa Stanek Rea
*Acting Director of the United States Patent and Trademark Office*